(12) United States Patent
Sasaki et al.

(10) Patent No.: US 9,611,567 B2
(45) Date of Patent: Apr. 4, 2017

(54) METHOD FOR CONTROLLING DONOR CONCENTRATION IN GA$_2$O$_3$-BASED AND METHOD FOR FORMING OHMIC CONTACT

(71) Applicants: TAMURA CORPORATION, Tokyo (JP); National Institute of Information and Communications Technology, Koganei-shi, Tokyo (JP)

(72) Inventors: Kohei Sasaki, Tokyo (JP); Masataka Higashiwaki, Koganei (JP)

(73) Assignees: TAMURA CORPORATION, Tokyo (JP); NATIONAL INSTITUTE OF INFORMATION AND COMMUNICATIONS TECHNOLOGY, Koganei-Shi, Tokyo (JP)

(*) Notice: Subject to any disclaimer, the term of this patent is extended or adjusted under 35 U.S.C. 154(b) by 0 days.

(21) Appl. No.: 14/771,952

(22) PCT Filed: Feb. 25, 2014

(86) PCT No.: PCT/JP2014/054580
§ 371 (c)(1),
(2) Date: Sep. 1, 2015

(87) PCT Pub. No.: WO2014/132970
PCT Pub. Date: Sep. 4, 2014

(65) Prior Publication Data
US 2016/0002823 A1  Jan. 7, 2016

(30) Foreign Application Priority Data

Mar. 1, 2013 (JP) .................. 2013-040355
Jun. 21, 2013 (JP) .................. 2013-130780
Aug. 21, 2013 (JP) .................. 2013-171537

(51) Int. Cl.
*C30B 33/02* (2006.01)
*H01L 21/425* (2006.01)
(Continued)

(52) U.S. Cl.
CPC .............. *C30B 31/22* (2013.01); *C30B 29/16* (2013.01); *C30B 33/02* (2013.01); *H01B 1/08* (2013.01);
(Continued)

(58) Field of Classification Search
CPC ..... H01L 21/425; H01L 21/477; H01L 29/24; H01L 29/365; C30B 31/22; C30B 33/02
See application file for complete search history.

(56) References Cited

U.S. PATENT DOCUMENTS 6,897,560 B2   5/2005   Ota et al.
2004/0007708 A1   1/2004   Ichinose et al.
(Continued)

FOREIGN PATENT DOCUMENTS

JP   2004-056098 A   2/2004
JP   2005-235961 A   9/2005
(Continued)

OTHER PUBLICATIONS

International Search Report (ISR) (PCT Form PCT/ISA/210), in PCT/JP2014/054580, dated Mar. 25, 2014.

*Primary Examiner* — Pamela E Perkins
(74) *Attorney, Agent, or Firm* — McGinn IP Law Group, PLLC (57) ABSTRACT

Provided is a method for controlling a donor concentration in a Ga$_2$O$_3$-based single crystal body. In addition, an ohmic contact having a low resistance is formed between a Ga$_2$O$_3$-based single crystal body and an electrode. A donor concentration in a Ga$_2$O$_3$-based single crystal body is controlled by a method which includes a step wherein Si, which serves (Continued)

as a donor impurity, is introduced into the $Ga_2O_3$-based single crystal body by an ion implantation method at an implantation concentration of $1\times10^{20}$ $cm^{-3}$ or less, so that a donor impurity implanted region is formed in the $Ga_2O_3$-based single crystal body, the donor impurity implanted region having a higher donor impurity concentration than the regions into which Si is not implanted, and a step wherein Si in the donor impurity implanted region is activated by annealing, so that a high donor concentration region is formed.

20 Claims, 11 Drawing Sheets

(51) Int. Cl.
  *H01L 29/24* (2006.01)
  *C30B 31/22* (2006.01)
  *C30B 29/16* (2006.01)
  *H01B 1/08* (2006.01)
  *H01L 21/441* (2006.01)
  *H01L 21/477* (2006.01)
  *H01L 29/45* (2006.01)

(52) U.S. Cl.
  CPC .......... *H01L 21/425* (2013.01); *H01L 21/441* (2013.01); *H01L 21/477* (2013.01); *H01L 29/24* (2013.01); *H01L 29/45* (2013.01)

(56) References Cited

U.S. PATENT DOCUMENTS

| | | |
|---|---|---|
| 2006/0001031 A1 | 1/2006 | Ichinose et al. |
| 2007/0166967 A1* | 7/2007 | Ichinose ................ C30B 13/00 438/510 |
| 2008/0070337 A1 | 3/2008 | Ichinose et al. |
| 2008/0139004 A1* | 6/2008 | Yi ......................... H05B 33/10 438/799 |
| 2008/0237607 A1 | 10/2008 | Ichinose et al. |
| 2010/0038652 A1 | 2/2010 | Ichinose et al. |
| 2013/0248902 A1 | 9/2013 | Ichinose et al. |
| 2014/0217470 A1 | 8/2014 | Sasaki et al. |
| 2014/0220734 A1 | 8/2014 | Sasaki |
| 2014/0306237 A1 | 10/2014 | Ichinose et al. |
| 2015/0115279 A1 | 4/2015 | Sasaki |

FOREIGN PATENT DOCUMENTS

| | | |
|---|---|---|
| JP | 4083396 B2 | 4/2008 |
| JP | 4581270 B2 | 11/2010 |
| WO | WO 2009/034831 A1 | 3/2009 |
| WO | WO 2013/035465 A1 | 3/2013 |
| WO | WO 2013/035843 A1 | 3/2013 |

* cited by examiner

METHOD FOR CONTROLLING DONOR CONCENTRATION IN GA₂O₃-BASED AND METHOD FOR FORMING OHMIC CONTACT

TECHNICAL FIELD

The invention relates to a method for controlling a donor concentration in a Ga$_2$O$_3$-based single crystal body and a method for forming an ohmic contact.

BACKGROUND ART

A conventional method of forming a Ga$_2$O$_3$ single crystal is known in which a Ga$_2$O$_3$ single crystal is grown while adding a Group IV element such as Si and Sn so as to impart conductivity to the Ga$_2$O$_3$ single crystal (see e.g. PTL 1).

An another conventional method of forming a Ga$_2$O$_3$ single crystal is also known in which a β-Ga$_2$O$_3$ crystal is heteroepitaxially grown on a sapphire substrate while adding an impurity such as Sn so as to form a β-Ga$_2$O$_3$ crystal film with conductivity (see e.g. PTL 2).

A method of introducing an impurity ion into a SiC crystal by ion implantation is also known (see e.g. PTL 3).

CITATION LIST

Patent Literature

[PTL 1]
JP-A-2005-235961
[PTL 2]
JP-B-4083396
[PTL 3]
JP-B-4581270

SUMMARY OF INVENTION

Technical Problem

The ion implantation process is difficult to use in introducing an impurity into an oxide single crystal such as Ga$_2$O$_3$ single crystal so as to impart the conductivity. This is because oxides are likely to be damaged by ion implantation and the damage is difficult to be sufficiently recovered even if annealing treatment is conducted after the ion implantation. It is assumed that, in the oxide single crystal, oxygen deficiency during the ion implantation causes an increase in the crystal damage.

By contrast, the ion implantation process is advantageous in that impurity concentration can be controlled after forming a base crystal or it is relatively easy to locally introduce the impurity.

Thus, it is an object of the invention to provide a method for controlling a donor concentration in a Ga$_2$O$_3$-based single crystal body by using an ion implantation method so as to form a region having excellent conductivity in the Ga$_2$O$_3$-based single crystal body.

It is another object of the invention to form a low resistance ohmic contact between a Ga$_2$O$_3$-based single crystal body and an electrode by implanting a donor into the Ga$_2$O$_3$-based single crystal body by the ion implantation method.

Solution to Problem

According to one embodiment of the invention, a method for controlling a donor concentration in a Ga$_2$O$_3$-based single crystal body set forth in [1] to [8] below is provided so as to achieve the above object.

[1] A method for controlling a donor concentration in a Ga$_2$O$_3$ single crystal body, comprising:
a step of introducing Si as a donor impurity into the Ga$_2$O$_3$ single crystal body by an ion implantation method at an implantation concentration of not more than 1×10$^{20}$ cm$^{-3}$ so as to form a donor impurity implanted region in the Ga$_2$O$_3$ single crystal body, the donor impurity implanted region having a higher donor impurity concentration than a region into which the Si is not implanted; and
a step of activating the Si in the donor impurity implanted region by annealing so as to form a high donor concentration region.

[2] The method for controlling a donor concentration in a Ga$_2$O$_3$ single crystal body according to [1], wherein the implantation concentration is not less than 1×10$^{17}$ cm$^{-3}$.

[3] The method for controlling a donor concentration in a Ga$_2$O$_3$ single crystal body according to [2], wherein the implantation concentration is not less than 1×10$^{19}$ cm$^{-3}$ and not more than 1×10$^{20}$ cm$^{-3}$.

[4] The method for controlling a donor concentration in a Ga$_2$O$_3$ single crystal body according to [3], wherein the implantation concentration is not less than 2×10$^{17}$ cm$^{-3}$ and not more than 5×10$^{19}$ cm$^{-3}$.

[5] The method for controlling a donor concentration in a Ga$_2$O$_3$ single crystal body according to [2], wherein the implantation concentration is not less than 3×10$^{17}$ cm$^{-3}$ and not more than 5×10$^{17}$ cm$^{-3}$.

[6] The method for controlling a donor concentration in a Ga$_2$O$_3$ single crystal body according to [3] or [4], wherein the annealing is conducted in a nitrogen atmosphere at not less than 800° C. and not more than 1150° C.

[7] The method for controlling a donor concentration in a Ga$_2$O$_3$ single crystal body according to [5], wherein the annealing is conducted in a nitrogen atmosphere at not less than 800° C. and not more than 1000° C.

[8] The method for controlling a donor concentration in a Ga$_2$O$_3$ single crystal body according to any one of [1] to [5], wherein the annealing is conducted in a nitrogen atmosphere at not less than 900° C. and not more than 1000° C.

According to another embodiment of the invention, a method for forming an ohmic contact set forth in [9] below is provided so as to achieve the above object.

[9] A method for forming an ohmic contact, comprising:
a step of introducing Si as a donor impurity into a Ga$_2$O$_3$ single crystal body by an ion implantation method at an implantation concentration of not less than 2×10$^{19}$ cm$^{-3}$ and not more than 1×10$^{20}$ cm$^{-3}$ so as to form a donor impurity implanted region in the Ga$_2$O$_3$ single crystal body, the donor impurity implanted region having a higher donor impurity concentration than a region into which the Si is not implanted;
a step of activating the Si in the donor impurity implanted region by annealing so as to form a high donor concentration region; and a step of forming an electrode on the Ga$_2$O$_3$ single crystal body so as to form an ohmic contact of the high donor concentration region and the electrode.

Advantageous Effects of the Invention

According to the invention, a method for controlling a donor concentration in a Ga$_2$O$_3$-based single crystal body by using an ion implantation method can be provided so as to form a region having excellent conductivity in the Ga$_2$O$_3$-based single crystal body. Further, according to the invention, a low resistance ohmic contact can be formed between a $Ga_2O_3$-based single crystal body and an electrode by implanting a donor into the $Ga_2O_3$-based single crystal body by the ion implantation method.

DESCRIPTION OF EMBODIMENTS

First Embodiment

According to the present embodiment, a high donor concentration region having excellent conductivity is formed in a $Ga_2O_3$-based single crystal body by introducing Si as a donor impurity at a predetermined implantation concentration into the $Ga_2O_3$-based single crystal body using an ion implantation method and then conducting annealing treatment.

A $Ga_2O_3$-based single crystal body in the present embodiment is constructed from a $Ga_2O_3$ single crystal or a $Ga_2O_3$ single crystal doped with elements such as Al and In. It may be, e.g., a $(Ga_xAl_yIn_{(1-x-y)})_2O_3$ ($0<x\leq1$, $0\leq y\leq1$, $0<x+y\leq1$) crystal which is a $Ga_2O_3$ crystal doped with Al and In. The band gap is widened by adding Al and is narrowed by adding In.

The $Ga_2O_3$-based single crystal body is, e.g., a β-$Ga_2O_3$-based single crystal body but may be a $Ga_2O_3$-based single crystal body having another structure such as a-$Ga_2O_3$-based single crystal body.

The $Ga_2O_3$-based single crystal body is, e.g., a $Ga_2O_3$-based single crystal substrate or a $Ga_2O_3$-based crystal film formed on a supporting substrate.

Figure 1A:
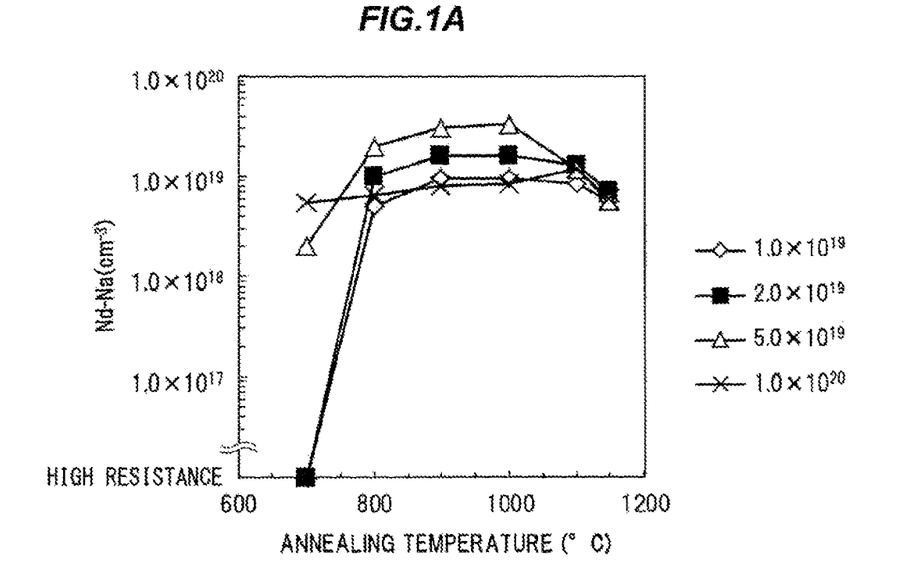
FIG. 1A is a graph showing a relation between annealing temperature and an effective donor concentration in a high donor concentration region in a first embodiment when Si is ion-implanted into a $Ga_2O_3$-based single crystal body.
Figure 1B:
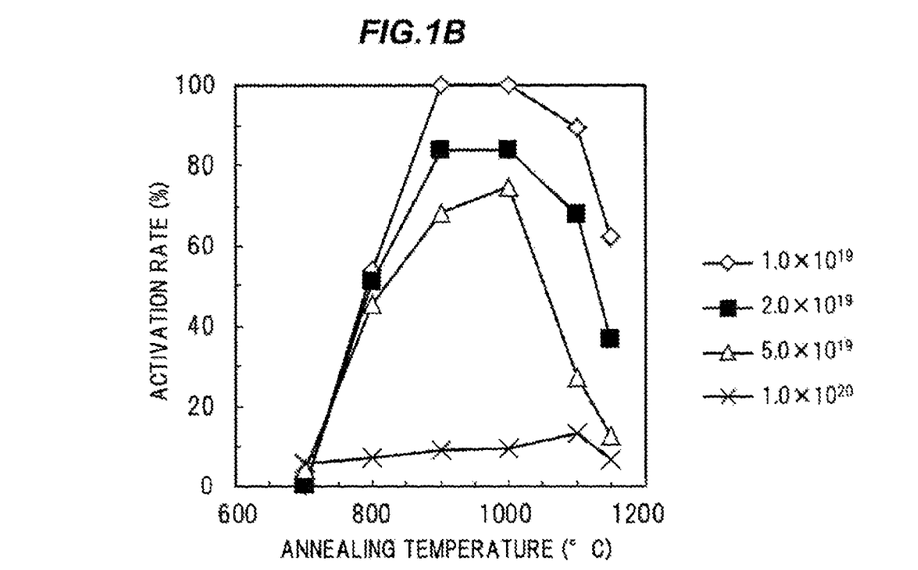
FIG. 1B is a graph showing a relation between annealing temperature and an activation rate in the first embodiment when Si is ion-implanted into a $Ga_2O_3$-based single crystal body.

FIG. 1A is a graph showing a relation between annealing temperature and an effective donor concentration in a high donor concentration region when Si is ion-implanted into a $Ga_2O_3$-based single crystal body. FIG. 1B is a graph showing a relation between annealing temperature and an activation rate when Si is ion-implanted into a $Ga_2O_3$-based single crystal body.

Herein, the effective donor concentration is defined by a difference between a donor concentration Nd and an acceptor concentration Na in the high donor concentration region and serves as an index of conductivity. The activation rate is defined by a ratio of the effective donor concentration to the Si implantation concentration. It becomes easy to control a donor concentration according as the activation rate is close to 1 (100%).

FIGS. 1A and 1B shows data obtained when the Si implantation concentration is $1\times10^{19}$ $cm^{-3}$ (open diamond markers "◇"), $2\times10^{19}$ $cm^{-3}$ (filled squire markers "■"), $5\times10^9$ $cm^{-3}$ (open triangle markers "Δ") and $1\times10^{20}$ $cm^{-3}$ (cross markers "X").

Figure 2:
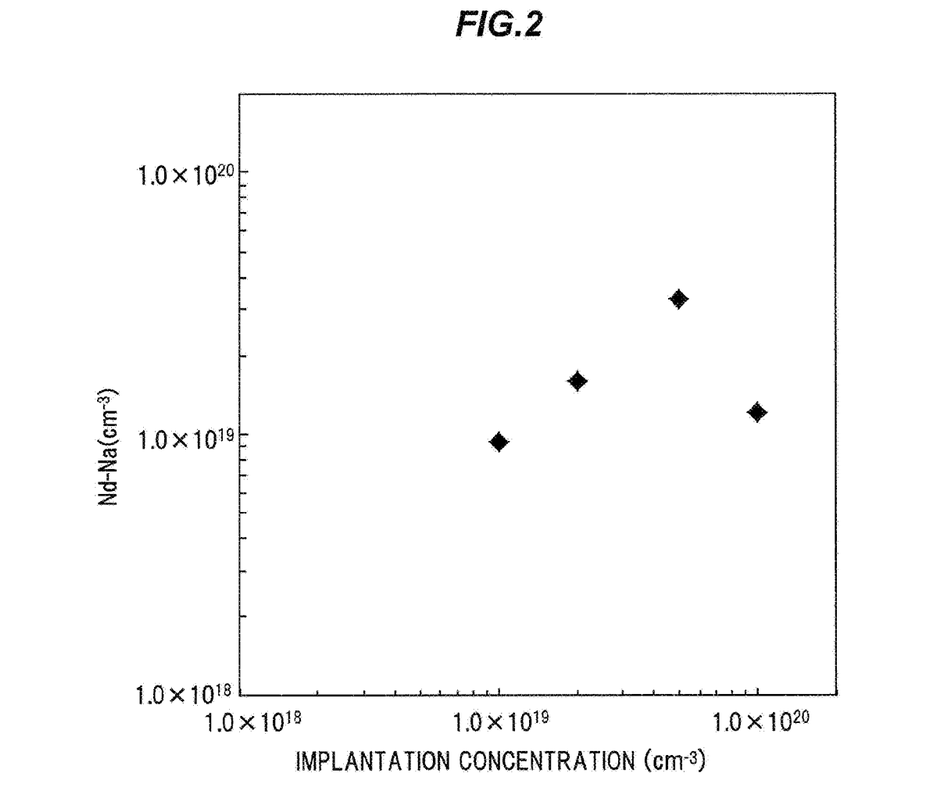
FIG. 2 is a graph showing a relation between a Si implantation concentration and an effective donor concentration in a high donor concentration region in the first embodiment when annealing temperature is 1000° C.

FIG. 2 is a graph showing a relation between a Si implantation concentration and an effective donor concentration in a high donor concentration region when annealing temperature and time are each 1000° C. and 30 minutes.

The annealing temperature in FIGS. 1A, 1B and 2 is temperature for annealing treatment in a nitrogen atmosphere, but provides the similar results when conducting annealing treatment in another inert atmosphere such as argon atmosphere.

FIG. 1B shows that the activation rate significantly decreases with an increase in the Si implantation concentration from $5\times10^{19}$ cm$^{-3}$ to $1\times10^{20}$ cm$^{-3}$. The Si implantation concentration of more than $1\times10^{20}$ cm$^{-3}$ only causes a decrease in the activation rate and an increase in the donor concentration is not anticipated. Therefore, the Si implantation concentration is set to not more than $1\times10^{20}$ cm$^{-3}$.

FIGS. 1A and 2 also show that a particularly high effective donor concentration is obtained when the Si implantation concentration is not less than $1\times10^{19}$ cm$^{-3}$ and not more than $1\times10^{20}$ cm$^{-3}$. Therefore, when the high donor concentration region is required to have higher conductivity, the Si implantation concentration is preferably not less than $1\times10^{19}$ cm$^{-3}$ and not more than $1\times10^{20}$ cm$^{-3}$.

Furthermore, the implantation concentration of not less than $2\times10^{19}$ cm$^{-3}$ and not more than $5\times10^{19}$ cm$^{-3}$ is more preferable since a higher effective donor concentration is obtained.

FIG. 1A also shows that the effective donor concentration in the high donor concentration region tends to be high when annealing temperature is not less than 800° C. and not more than 1150° C. Meanwhile, FIG. 1B shows that the activation rate tends to be high when annealing temperature is not less than 900° C. and not more than 1000° C.

Although the data shown in FIGS. 1A, 1B and 2 is obtained from a β-Ga$_2$O$_3$-based single crystal body used as the Ga$_2$O$_3$-based single crystal body, a relation between Si implantation concentration, annealing temperature and effective donor concentration shows the same tendency also when using a Ga$_2$O$_3$-based single crystal body having another structure of which preferable numerical ranges are thus the same as the ranges mentioned above.

Figure 3A:
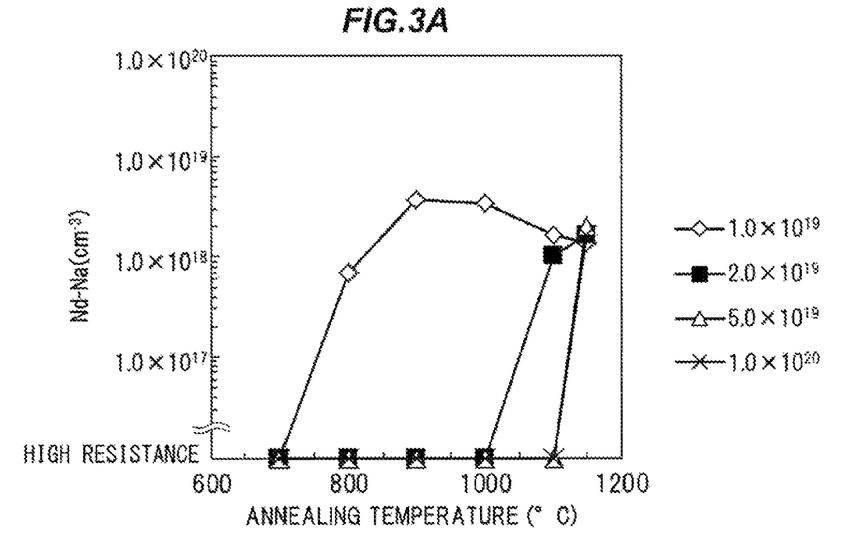
FIG. 3A is a graph showing a relation between annealing temperature and an effective donor concentration in a high donor concentration region when Sn is ion-implanted into a $Ga_2O_3$-based single crystal body instead of implanting Si.
Figure 3B:
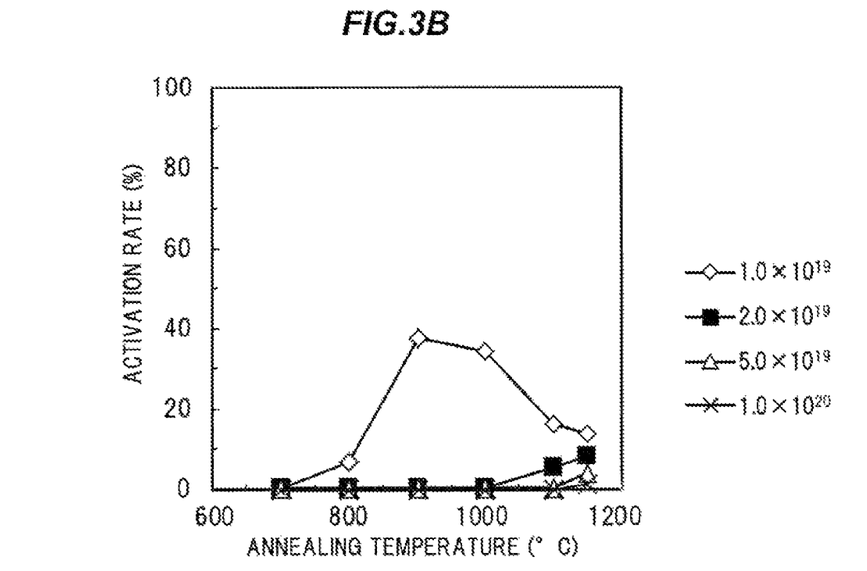
FIG. 3B is a graph showing a relation between annealing temperature and an activate rate when Sn is ion-implanted into a $Ga_2O_3$-based single crystal body instead of implanting Si.

FIG. 3A is a graph showing a relation between annealing temperature and an effective donor concentration in a high donor concentration region when Sn is ion-implanted into a Ga$_2$O$_3$-based single crystal body instead of implanting Si. FIG. 3B is a graph showing a relation between annealing temperature and an activate rate when Sn is ion-implanted into a Ga$_2$O$_3$-based single crystal body instead of implanting Si.

FIGS. 3A and 3B show that both the effective donor concentration and the activation rate are the highest at the Sn implantation concentration of $1\times10^{19}$ cm$^{-3}$ and decreases with a decrease in the implantation concentration.

When Si is ion-implanted, it is possible to increase the effective donor concentration by increasing the implantation concentration to higher than $1\times10^{19}$ cm$^{-3}$. On the other hand, when Sn is ion-implanted, the effective donor concentration decreases when increasing the implantation concentration to higher than $1\times10^{19}$ cm$^{-3}$.

One of the reasons is considered as follows: even when the Si implantation concentration is increased, damage on the Ga$_2$O$_3$-based single crystal body is small and can be recovered by annealing treatment. However, when the Sn implantation concentration is increased, damage on the Ga$_2$O$_3$-based single crystal body is too severe to recover.

Figure 4A:
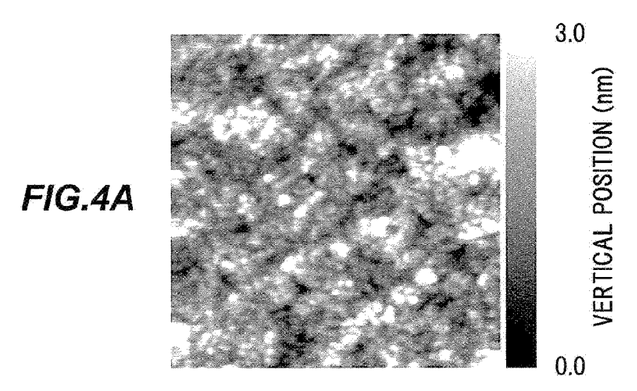
FIG. 4A is an atomic force microscopy image showing a Sn-implanted $Ga_2O_3$-based single crystal body.
Figure 4B:
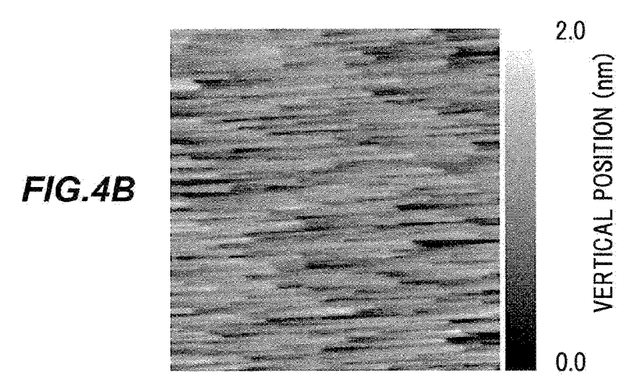
FIG. 4B is an atomic force microscopy image showing a Si-implanted $Ga_2O_3$-based single crystal body in the first embodiment.
Figure 4C:
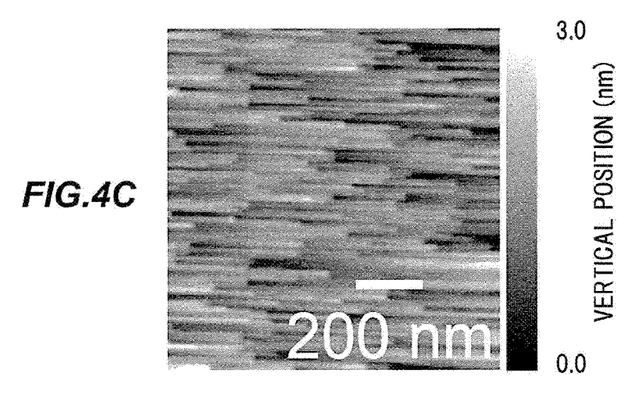
FIG. 4C is an atomic force microscopy image showing a $Ga_2O_3$-based single crystal body without ion implantation.

FIGS. 4A, 4B and 4C are atomic force microscopy images each showing a Sn-implanted Ga$_2$O$_3$-based single crystal body, a Si-implanted Ga$_2$O$_3$-based single crystal body and a Ga$_2$O$_3$-based single crystal body without ion implantation. The donor implantation concentration in the Ga$_2$O$_3$-based single crystal bodies in FIGS. 4A and 4B is $5\times10^{19}$ cm$^{-3}$ and annealing temperature is 1000° C. for the Ga$_2$O$_3$-based single crystal bodies in FIGS. 4A, 4B and 4C.

FIGS. 4A, 4B and 4C are vertical images showing the respective surfaces of the Ga$_2$O$_3$-based single crystal bodies, and a bar with vertical color gradation on the right side of each image is to indicate a vertical position. For example, in FIG. 4A, a position of the darkest (black) portion in the image is the reference and the position of the lightest (white) portion is 3.0 nm. The magnification of the image is the same in FIGS. 4A, 4B and 4C.

A crystal plane with a stepped pattern appears on the surface of the Ga$_2$O$_3$-based single crystal body without ion implantation in FIG. 4C. The Si-implanted Ga$_2$O$_3$-based single crystal body in FIG. 4B, which has substantially the same surface state as the Ga$_2$O$_3$-based single crystal body without ion implantation in FIG. 4C, shows that damage thereon caused by ion implantation is recovered by annealing treatment and high crystal quality is thus obtained.

On the other hand, a crystal plane does not appear on the surface of the Sn-implanted Ga$_2$O$_3$-based single crystal body in FIG. 4A and this shows that damage thereon caused by ion implantation is not recovered by annealing treatment.

Next, a process of forming a high donor concentration region in a Ga$_2$O$_3$-based single crystal body in the present embodiment will be described as an example.

FIGS. 5A to 5D are vertical cross-sectional views of a Ga$_2$O$_3$-based single crystal body, showing an example process of forming a high donor concentration region.

Figure 5A:
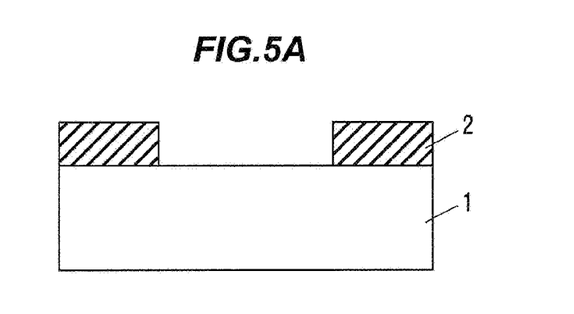
FIG. 5A is a vertical cross-sectional view of a $Ga_2O_3$-based single crystal body, showing an example process of forming a high donor concentration region in the first embodiment.

Firstly, as shown in FIG. 5A, a mask 2 having a predetermined pattern is formed on a Ga$_2$O$_3$-based single crystal body 1. The mask 2 is formed using a photolithography technique, etc.

Figure 5B:
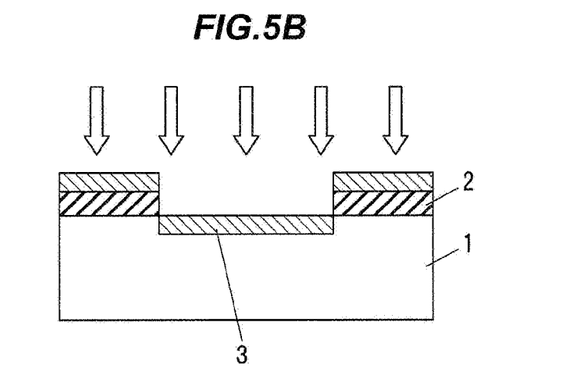
FIG. 5B is a vertical cross-sectional view of a $Ga_2O_3$-based single crystal body, showing an example process of forming a high donor concentration region in the first embodiment.

Next, as shown in FIG. 5B, Si is implanted into the Ga$_2$O$_3$-based single crystal body 1 by ion implantation and a donor impurity implanted region 3 is thereby formed on a surface of the Ga$_2$O$_3$-based single crystal body 1. At this point, since Si is not implanted into a region of the Ga$_2$O$_3$-based single crystal body 1 covered with the mask 2, the donor impurity implanted region 3 is formed in a partial region of the surface of the Ga$_2$O$_3$-based single crystal body 1. The donor impurity concentration in the donor impurity implanted region 3 is higher than that of the Ga$_2$O$_3$-based single crystal body 1 in the region with no Si implanted.

The Si implantation concentration is not more than $1\times10^{20}$ cm$^{-3}$, preferably not less than $1\times10^{19}$ cm$^{-3}$ and not more than $1\times10^{20}$ cm$^{-3}$, more preferably not less than $2\times10^{1}$ cm$^{-3}$ and not more than $5\times10^{19}$ cm$^{-3}$.

Alternatively, the donor impurity implanted region 3 may be formed on the entire surface of the Ga$_2$O$_3$-based single crystal body 1 by ion implantation without using the mask 2. In addition, it is possible to control depth or concentration distribution of the donor impurity implanted region 3 by adjusting the ion implantation conditions.

Figure 5C:
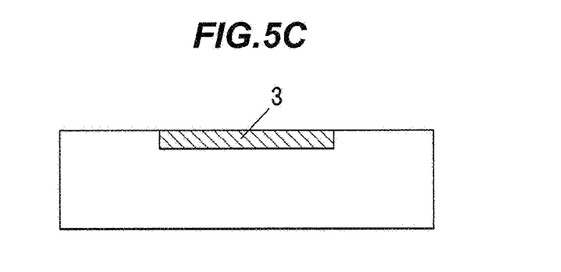
FIG. 5C is a vertical cross-sectional view of a $Ga_2O_3$-based single crystal body, showing an example process of forming a high donor concentration region in the first embodiment.

Next, the mask 2 is removed, as shown in FIG. 5C.

Figure 5D:
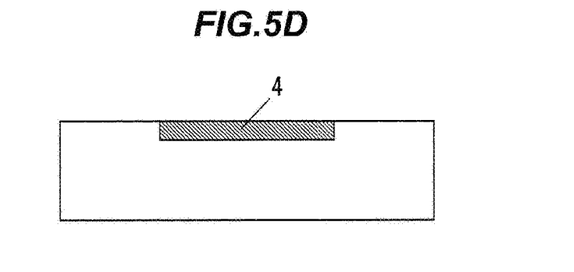
FIG. 5D is a vertical cross-sectional view of a $Ga_2O_3$-based single crystal body, showing an example process of forming a high donor concentration region in the first embodiment.

After that, the donor impurity in the donor impurity implanted region 3 is activated by conducting annealing treatment, thereby forming a high donor concentration region 4 having a high donor concentration, as shown in FIG. 5D. Damage on the Ga$_2$O$_3$-based 1$i$ single crystal body 1 caused by the ion implantation can be also recovered by this annealing treatment.

The annealing treatment is conducted in an inert atmosphere such as nitrogen atmosphere and argon atmosphere preferably at not less than 800° C. and not more than 1150° C., more preferably at not less than 900° C. and not more than 1000° C.

Effects of the First Embodiment

According to the first embodiment, it is possible to form a high donor concentration region having excellent conductivity in the $Ga_2O_3$-based single crystal body by introducing Si as a donor impurity at a predetermined implantation concentration into the $Ga_2O_3$-based single crystal body using an ion implantation method and then conducting annealing treatment.

When, for example, Sn is used as a donor impurity, the optimal value of the implantation concentration is about $1\times10^{19}$ cm$^{-3}$ and the concentration higher than this value causes a sharp decrease in the effective donor concentration. On the other hand, in the present embodiment in which Si is used as a donor impurity, it is possible to improve the effective donor concentration by increasing the implantation concentration to higher than $1\times10^{19}$ cm$^{-3}$. Although the optimal value of the Si implantation concentration is about $5\times10^{19}$ cm$^{-3}$, the effective donor concentration does not decrease sharply even at a higher concentration.

Second Embodiment

According to the second embodiment, a high donor concentration region to be in ohmic contact with an electrode is formed in a $Ga_2O_3$-based single crystal body by introducing Si as a donor impurity at a predetermined implantation concentration into the $Ga_2O_3$-based single crystal body using an ion implantation method and then conducting annealing treatment. This high donor concentration region is formed by multistage implantation with an ion implantation energy varying in a stepwise manner and has a box-shaped profile.

Figure 6A:
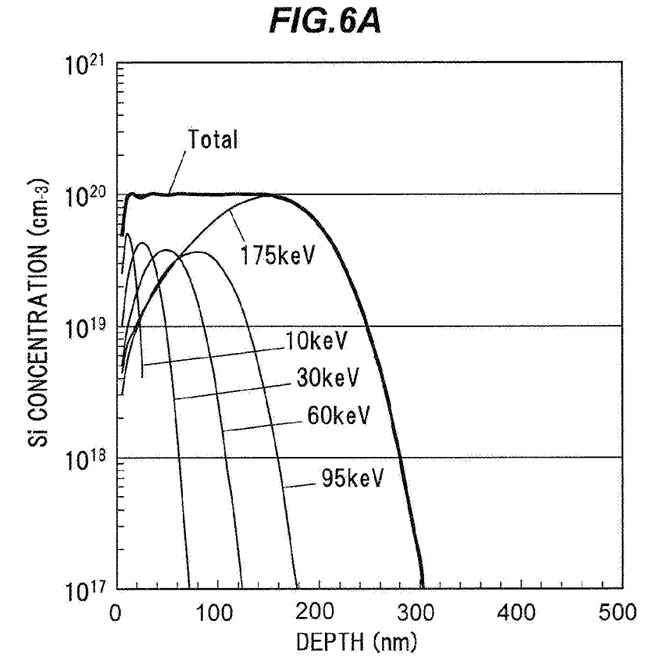
FIG. 6A is a graph showing calculated profiles of donor impurity implanted regions formed by multistage implantation at various implantation energies and a total calculated profile in a second embodiment.

FIG. 6A is a graph showing calculated profiles of donor impurity implanted regions formed by multistage implantation at various implantation energies and a total calculated profile. In FIG. 6A, calculation results when an average donor impurity concentration is $1\times10^{20}$ cm$^{-3}$ are shown as an example. FIG. 6A shows that a donor impurity implanted region having a box-shaped profile is obtained by multistage implantation.

Figure 6B:
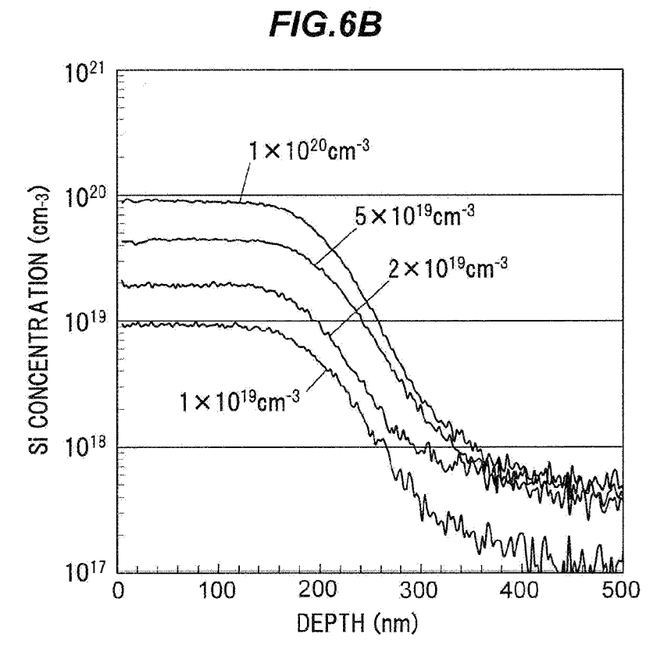
FIG. 6B is a graph showing actual measured profiles of donor impurity implanted regions formed by multistage implantation in the second embodiment.

FIG. 6B is a graph showing actual measured profiles of donor impurity implanted regions formed by multistage implantation. These profiles are obtained by analyzing a Si concentration in $Ga_2O_3$. FIG. 6B shows that donor impurity implanted regions each having a box-shaped profile with a depth of 150 nm are obtained at the implantation concentration of $1\times10^{19}$, $2\times10^{19}$, $5\times10^{19}$ and $1\times10^{20}$ cm$^{-3}$.

Figure 7A:
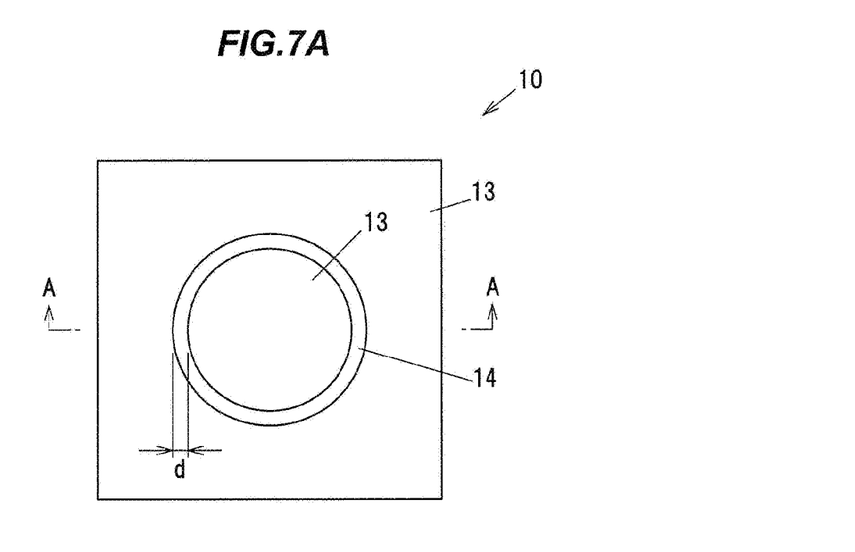
FIG. 7A is a top view showing a sample used to evaluate I-V characteristics and CTLM characteristics of an element including a high donor concentration region in the second embodiment.
Figure 7B:
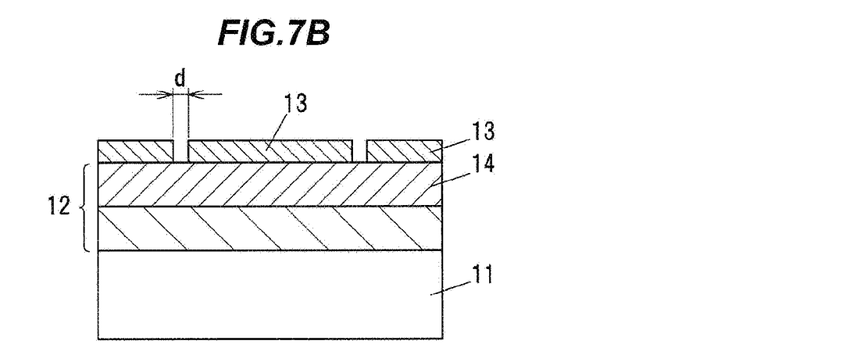
FIG. 7B is a vertical cross-sectional view showing the sample taken on line A-A of FIG. 7A.

FIG. 7A is a top view showing a sample 10 used to evaluate I-V characteristics and CTLM characteristics of an element including a high donor concentration region. FIG. 7B is a vertical cross-sectional view showing the sample 10 taken on line A-A of FIG. 7A.

The sample 10 has a high-resistivity $Ga_2O_3$ substrate 11 containing Fe, a $Ga_2O_3$ layer 12 formed on the $Ga_2O_3$ substrate 11, a high donor concentration region 14 provided as an upper layer of the $Ga_2O_3$ layer 12 and containing Si at a high concentration, and an electrode 13 formed on the $Ga_2O_3$ layer 12 and having a CTLM (Circular Transmission Line Model) pattern.

The $Ga_2O_3$ substrate 11 is a substrate formed of a β-$Ga_2O_3$ single crystal and has a main surface which is a (010) plane. The $Ga_2O_3$ layer 12 is a layer formed of a β-$Ga_2O_3$ single crystal and has a 150 nm-thick upper layer as the high donor concentration region 14 and a 150 nm-thick lower layer not containing a dopant.

To obtain the high donor concentration region 14, a donor impurity implanted region is formed by ion-implanting Si into an upper portion of the $Ga_2O_3$ layer 12 and Si in the donor impurity implanted region is activated by activation annealing treatment in a nitrogen atmosphere at 950° C. for 30 minutes.

The electrode 13 has a two-layer structure of Ti/Au in which a Ti layer and an Au layer are each 50 nm and 300 nm in thickness. After forming the electrode 13, annealing treatment is conducted on the electrode in a nitrogen atmosphere at 450° C. for 1 minute.

Samples 10 each having electrode spacing d of 5, 10, 15, 20, 25 and 30 μm on the CTLM pattern on the electrode 13 were formed, and I-V characteristics and CTLM characteristics were evaluated. The diameter of the circular portion of the electrode 13 was fixed to about 350 μm.

Figure 8A:
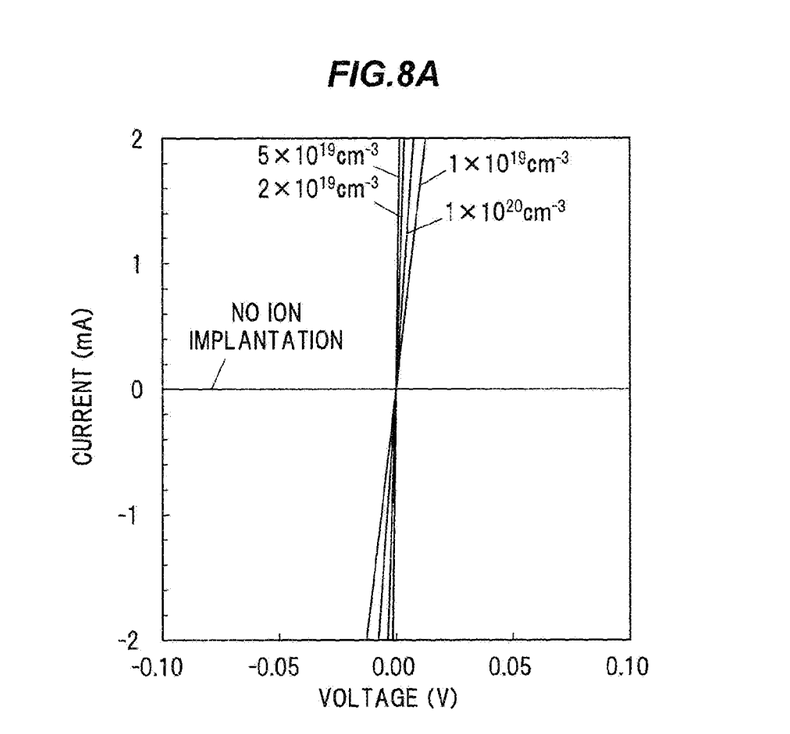
FIG. 8A is a graph showing I-V characteristics of a sample with an electrode spacing d of 5 μm in the second embodiment.

FIG. 8A is a graph showing I-V characteristics of the sample 10 with an electrode spacing d of 5 μm. FIG. 8A shows that all of the samples formed by ion-implanting Si into the $Ga_2O_3$ layer 12 at the implantation concentration of $1\times10^{19}$, $2\times10^{19}$, $5\times10^{19}$ and $1\times10^{20}$ cm$^{-3}$ exhibit linear I-V characteristics and have a good ohmic contact between the $Ga_2O_3$ layer 12 and the electrode 13. On the other hand, no current flows through the sample which was used as Comparative Example and had the $Ga_2O_3$ layer 12 not containing a dopant.

Figure 8B:
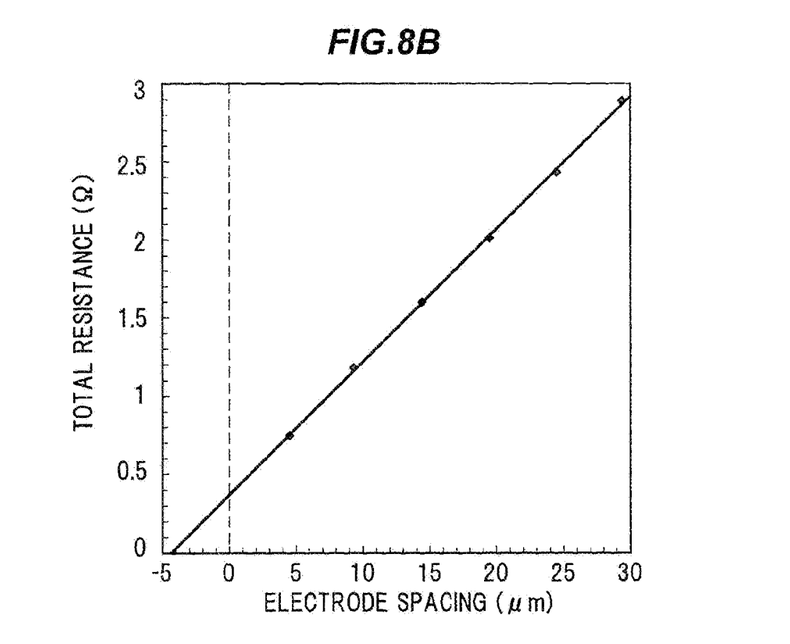
FIG. 8B is a graph showing CTLM characteristics of a sample in which Si is implanted at an implantation concentration of $5 \times 10^{19}$ $cm^{-3}$ into a $Ga_2O_3$-based single crystal body in the second embodiment.

FIG. 8B is a graph showing CTLM characteristics of the sample 10 in which Si is implanted into the $Ga_2O_3$ layer 12 at an implantation concentration of $5\times10^{19}$ cm$^{-3}$. FIG. 8B shows that a good linear relation is exhibited between the electrode spacing d (5, 10, 15, 20, 25 and 30 μm) and total resistance, the high donor concentration region 14 formed by ion implantation of Si has uniform conductivity in an in-plane direction and a depth direction of the $Ga_2O_3$ layer 12, and furthermore, contact resistance between the $Ga_2O_3$ layer 12 and the electrode 13 is uniform in the in-plane of the $Ga_2O_3$ layer 12.

Sheet resistance Rs of the $Ga_2O_3$ layer 12 can be obtained from the slope of the straight line in the graph of CTLM characteristics as shown in FIG. 8B and the electrode spacing, and propagation length Lt can be obtained from an intersection point between the straight line and the horizontal axis. Since contact resistance is equal to Rs×Lt$^2$, contact resistance of the sample formed by ion-implanting Si into the $Ga_2O_3$ layer 12 at an implantation concentration of $5\times10^{19}$ cm$^{-3}$ can be obtained from FIG. 8B.

Figure 9A:
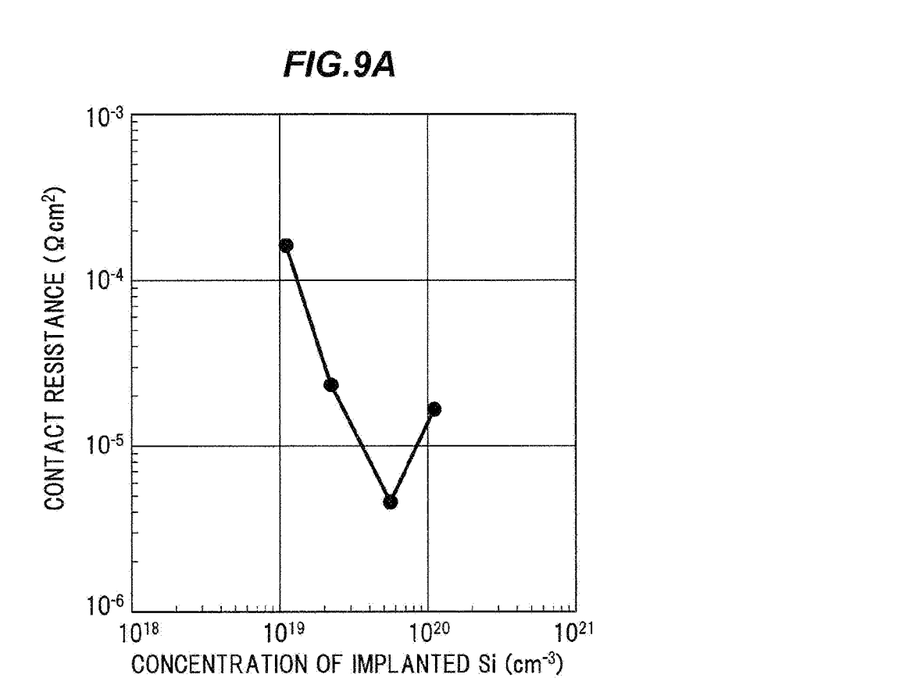
FIG. 9A is a graph showing a relation between a Si implantation concentration in a $Ga_2O_3$ layer and contact resistance between a high donor concentration region and an electrode in the second embodiment.

FIG. 9A is a graph showing a relation between a Si implantation concentration in the $Ga_2O_3$ layer 12 and contact resistance between the high donor concentration region 14 and the electrode 13. FIG. 9A shows that an ohmic contact having a particularly low resistance (less than $2.3\times10^{-5}$ Ωcm$^2$) is formed when the implantation concentration is from $2\times10^{19}$ to $1\times10^{20}$ cm$^{-3}$. It is also shown that the minimum contact resistance ($4.6\times10^{-6}$ Ωcm$^2$) is obtained when the implantation concentration is $5\times10^{19}$ cm$^{-3}$.

Figure 9B:
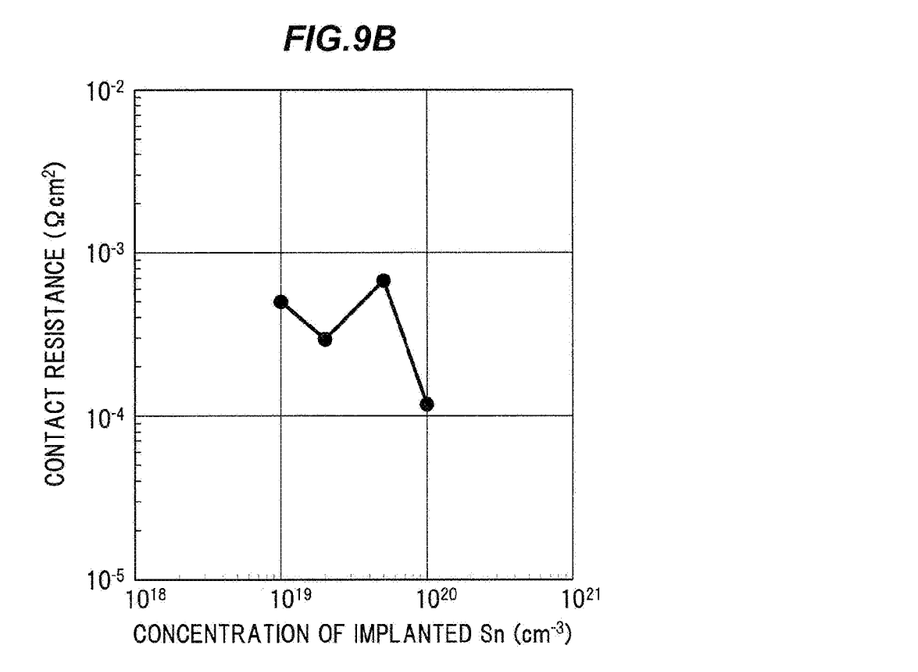
FIG. 9B is a graph showing a relation between a Sn implantation concentration in a $Ga_2O_3$ layer and contact resistance between a high donor concentration region and an electrode in Comparative Example in which the high donor concentration region is formed by ion-implanting Sn instead of Si.

FIG. 9B is a graph showing a relation between a Sn implantation concentration in the $Ga_2O_3$ layer 12 and contact resistance between the high donor concentration region and the electrode 13 in Comparative Example in which the high donor concentration region is formed by ion-implanting Sn instead of Si. FIG. 9B shows that, when the high donor concentration region is formed by ion implantation of Sn, contact resistance is not reduced to below 1 to $2\times10^{-4}$ Ωcm$^2$ even if the implantation concentration is increased. As shown in FIGS. 3A and 3B, when the Sn implantation concentration is increased to higher than $1\times10^{19}$ cm$^{-3}$, the activation rate sharply decreases and the effective donor concentration does not increase. It is therefore considered that contact resistance is not reduced even if the implantation concentration is increased to higher than $1\times10^{20}$ cm$^{-3}$.

For an ohmic contact in electronic devices such as electric field effect transistors and Schottky-barrier diodes, a contact resistance value of about not more than $5\times10^{-5}$ Ωcm$^2$ is required. When contact resistance is higher than such a value, loss of the contact electrode becomes too large. So far, there is no technique allowing an ohmic contact satisfying the above-mentioned conditions to be form on Ga$_2$O$_3$, and it is difficult to put Ga$_2$O$_3$ electronic devices into practical use. Use of Sn is known as a conventional technique to form an ohmic contact but, as a result of close examination of a relation between the Sn implantation concentration and an ohmic contact, it was found that contact resistance satisfying the above-mentioned conditions is not obtained. Then, it was revealed that a low resistance ohmic contact applicable to devices can be formed by implanting Si as an ion implanting species at a concentration of $2\times10^{19}$ to $1\times10^{20}$ cm$^{-3}$.

Effects of the Second Embodiment

According to the second embodiment, a high donor concentration region is formed by ion implantation of Si at an implantation concentration suitable for forming a low resistance ohmic contact, thereby allowing a low-resistance ohmic contact to be formed between the high donor concentration region and the electrode.

Third Embodiment

In the third embodiment, a high donor concentration region having a lower Si implantation concentration than in the high donor concentration region evaluated in the first embodiment was formed and evaluated. The high donor concentration region in the third embodiment is used as, e.g., a channel region of a transistor. The method of forming a high donor concentration region is the same as that used in the first embodiment.

Figure 10:
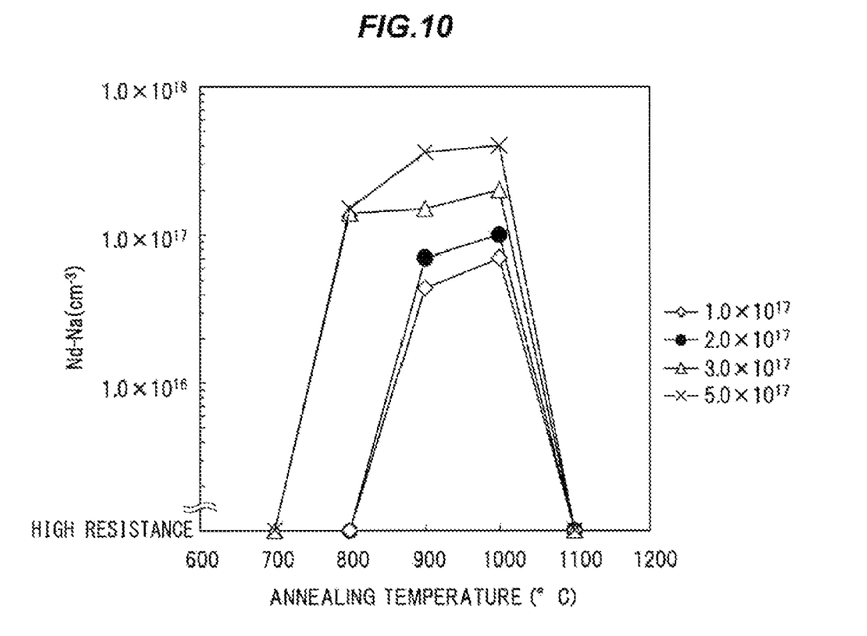
FIG. 10 is a graph showing a relation between annealing temperature and an effective donor concentration in a high donor concentration region in a third embodiment when Si is ion-implanted into a $Ga_2O_3$-based single crystal body.

FIG. 10 is a graph showing a relation between annealing temperature and an effective donor concentration in a high donor concentration region when Si is ion-implanted into a Ga$_2$O$_3$-based single crystal body.

FIG. 10 shows data obtained when the Si implantation concentration is $1\times10^{17}$ cm$^{-3}$ (open diamond markers "◇"), $2\times10^{17}$ cm$^{-3}$ (filled circle markers "●"), $3\times10^{17}$ cm$^{-3}$ (open triangle markers "Δ") and $5\times10^{17}$ cm$^{-3}$ (cross markers "X").

The annealing temperature in FIG. 10 is temperature for annealing treatment in a nitrogen atmosphere, but provides the similar results when conducting annealing treatment in another inert atmosphere such as argon atmosphere.

FIG. 10 shows that the effective donor concentration in the high donor concentration region is high at an annealing temperature of not less than 900° C. and not more than 1000° C. when the Si implantation concentration is not less than $1\times10^{17}$ cm$^{-3}$ and not more than $2\times10^{17}$ cm$^{-3}$, and the effective donor concentration in the high donor concentration region tends to be high at an annealing temperature of not less than 800° C. and not more than 1000° ° C. when the Si implantation concentration is not less than $3\times10^{17}$ cm$^{-3}$ and not more than $5\times10^{17}$ cm$^{-3}$.

Figure 11:
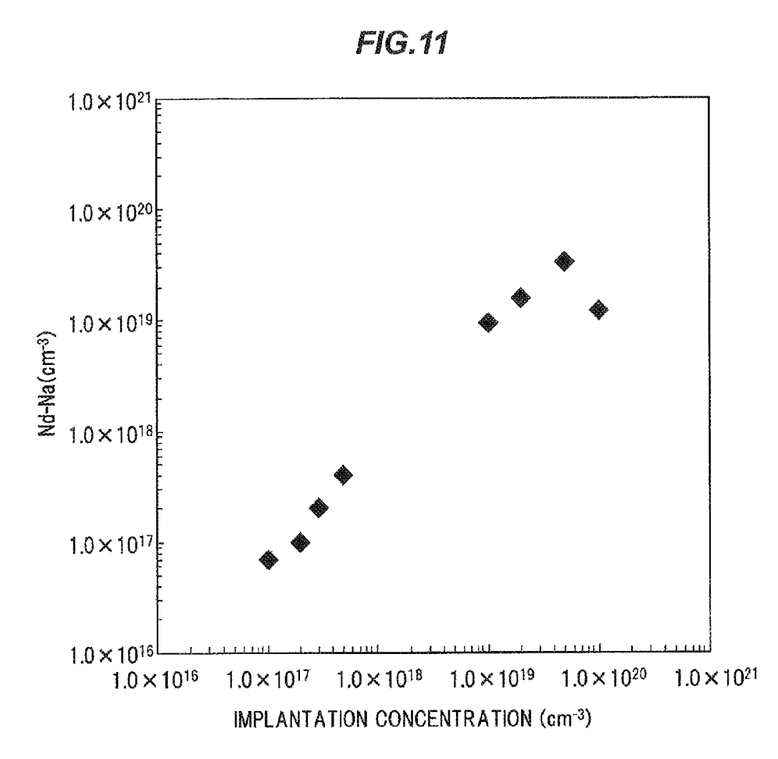
FIG. 11 is a graph showing a relation between a Si implantation concentration and an effective donor concentration in a high donor concentration region in the third embodiment when annealing temperature and time are each 1000° C. and 30 minutes.

FIG. 11 is a graph showing a relation between a Si implantation concentration and an effective donor concentration in a high donor concentration region when annealing temperature and time are each 1000° C. and 30 minutes. In FIG. 11, four measurement points on the left side are values obtained in the third embodiment, and another four measurement points on the right side are values obtained in the first embodiment.

FIG. 11 shows that, when Si implantation concentration is not less than $1\times10^{17}$ cm$^{-3}$ and not more than $1\times10^{20}$ cm$^{-3}$ and when annealing treatment is conducted under the conditions by which the effective donor concentration is increased, the measurement points in both embodiments form a line close to a straight line indicating that a ratio of the effective donor concentration to the Si implantation concentration (the activation rate) is 1, and it is easy to control a donor concentration.

Thus, annealing temperature is preferably not less than 900° C. and not more than 1000° C. at the Si implantation concentration of not less than $1\times10^{17}$ cm$^{-3}$ and not more than $2\times10^{17}$ cm$^{-3}$, and is preferably not less than 800° C. and not more than 1000° C. at the Si implantation concentration of not less than $3\times10^{17}$ cm$^{-3}$ and not more than $5\times10^{17}$ cm$^{-3}$.

Although the data shown in FIGS. 10 and 11 is obtained from a β-Ga$_2$O$_3$-based single crystal body used as the Ga$_2$O$_3$-based single crystal body, a relation between Si implantation concentration, annealing temperature and effective donor concentration shows the same tendency also when using a Ga$_2$O$_3$-based single crystal body having another structure of which preferable numerical ranges are thus the same as the ranges mentioned above.

Although the first to third embodiments of the invention have been described, the invention is not intended to be limited to the first to third embodiments, and the various kinds of modifications can be implemented without departing from the gist of the invention.

In addition, the invention according to claims is not to be limited to the embodiments. Further, it should be noted that all combinations of the features described in the embodiments are not necessary to solve the problem of the invention.

INDUSTRIAL APPLICABILITY

The invention provides a method for controlling a donor concentration in a Ga$_2$O$_3$-based single crystal body by using an ion implantation method can be provided so as to form a region having excellent conductivity in the Ga$_2$O$_3$-based single crystal body. Further, a low resistance ohmic contact is formed between a Ga$_2$O$_3$-based single crystal body and an electrode.

REFERENCE SIGNS LIST

1 Ga$_2$O$_3$-BASED SINGLE CRYSTAL BODY
3 DONOR IMPURITY IMPLANTED REGION
4 HIGH DONOR CONCENTRATION REGION
12 Ga$_2$O$_3$ LAYER
14 HIGH DONOR CONCENTRATION REGION
13 ELECTRODE

The invention claimed is:
1. A method for controlling a donor concentration in a Ga$_2$O$_3$ single crystal body, the method comprising:
introducing Si as a donor impurity into the Ga$_2$O$_3$ single crystal body by an ion implantation method at an implantation concentration of not more than $1\times10^{20}$ cm$^{-3}$ so as to form a donor impurity implanted region in the Ga$_2$O$_3$ single crystal body, the donor impurity implanted region having a higher donor impurity concentration than a region into which the Si is not implanted; and activating the Si in the donor impurity implanted region by annealing so as to form a high donor concentration region.

2. The method for controlling a donor concentration in a $Ga_2O_3$ single crystal body according to claim 1, wherein the implantation concentration is not less than $1\times10^{17}$ $cm^{-3}$.

3. The method for controlling a donor concentration in a $Ga_2O_3$ single crystal body according to claim 2, wherein the implantation concentration is not less than $1\times10^{19}$ $cm^{-3}$ and not more than $1\times10^{20}$ $cm^{-3}$.

4. The method for controlling a donor concentration in a $Ga_2O_3$ single crystal body according to claim 3, wherein the implantation concentration is not less than $2\times10^{19}$ $cm^{-3}$ and not more than $5\times10^{19}$ $cm^{-3}$.

5. The method for controlling a donor concentration in a $Ga_2O_3$ single crystal body according to claim 4, wherein the annealing is conducted in a nitrogen atmosphere at not less than 800° C. and not more than 1150° C.

6. The method for controlling a donor concentration in a $Ga_2O_3$ single crystal body according to claim 4, wherein the annealing is conducted in a nitrogen atmosphere at not less than 900° C. and not more than 1000° C.

7. The method for controlling a donor concentration in a $Ga_2O_3$ single crystal body according to claim 3, wherein the annealing is conducted in a nitrogen atmosphere at not less than 800° C. and not more than 1150° C.

8. The method for controlling a donor concentration in a $Ga_2O_3$ single crystal body according to claim 3, wherein the annealing is conducted in a nitrogen atmosphere at not less than 900° C. and not more than 1000° C.

9. The method for controlling a donor concentration in a $Ga_2O_3$ single crystal body according to claim 2, wherein the implantation concentration is not less than $3\times10^{17}$ $cm^{-3}$ and not more than $5\times10^{17}$ $cm^{-3}$.

10. The method for controlling a donor concentration in a $Ga_2O_3$ single crystal body according to claim 9, wherein the annealing is conducted in a nitrogen atmosphere at not less than 800° C. and not more than 1000° C.

11. The method for controlling a donor concentration in a $Ga_2O_3$ single crystal body according to claim 9, wherein the annealing is conducted in a nitrogen atmosphere at not less than 900° C. and not more than 1000° C.

12. The method for controlling a donor concentration in a $Ga_2O_3$ single crystal body according to claim 2, wherein the annealing is conducted in a nitrogen atmosphere at not less than 900° C. and not more than 1000° C.

13. The method for controlling a donor concentration in a $Ga_2O_3$ single crystal body according to claim 1, wherein the annealing is conducted in a nitrogen atmosphere at not less than 900° C. and not more than 1000° C.

14. The method for controlling a donor concentration in a $Ga_2O_3$ single crystal body according to claim 1, wherein the implantation concentration is not more than $5\times10^{19}$ $cm^{-3}$.

15. The method for controlling a donor concentration in a $Ga_2O_3$ single crystal body according to claim 1, wherein the implantation concentration is not more than $5\times10^{17}$ $cm^{-3}$.

16. The method for controlling a donor concentration in a $Ga_2O_3$ single crystal body according to claim 1, wherein the $Ga_2O_3$ single crystal body comprises a $Ga_2O_3$ single crystal doped with Al and In.

17. The method for controlling a donor concentration in a $Ga_2O_3$ single crystal body according to claim 1, wherein the $Ga_2O_3$ single crystal body comprises an $\alpha$-$Ga_2O_3$-based single crystal body.

18. A method for forming an ohmic contact, the method comprising:

introducing Si as a donor impurity into a $Ga_2O_3$ single crystal body by an ion implantation method at an implantation concentration of not less than $2\times10^{19}$ $cm^{-3}$ and not more than $1\times10^{20}$ $cm^{-3}$ so as to form a donor impurity implanted region in the $Ga_2O_3$ single crystal body, the donor impurity implanted region having a higher donor impurity concentration than a region into which the Si is not implanted;

activating the Si in the donor impurity implanted region by annealing so as to faint a high donor concentration region; and forming an electrode on the $Ga_2O_3$ single crystal body so as to form an ohmic contact of the high donor concentration region and the electrode.

19. The method for forming the ohmic contact according to claim 18, wherein the implantation concentration is not more than $5\times10^{19}$ $cm^{-3}$.

20. The method for forming the ohmic contact according to claim 18, wherein the ohmic contact of the high donor concentration region is provided between the $Ga_2O_3$ single crystal body and the electrode.

* * * * *